United States Patent
Huynh et al.

(10) Patent No.: US 11,835,563 B2
(45) Date of Patent: Dec. 5, 2023

(54) SYSTEM AND METHOD FOR USING PULSED RADIO FREQUENCY (RF) SIGNALS AND A MODULATED SCATTERING PROBE (MSP) TO ENABLE MEASUREMENTS OF DISTANCE TO AND PLANARITY OF A SURFACE OF A DEVICE UNDER TEST (DUT)

(71) Applicant: LitePoint Corporation, San Jose, CA (US)

(72) Inventors: Minh-Chau Huynh, San Diego, CA (US); Morten Damgaard, Laguna Hills, CA (US); Christian Volf Olgaard, Saratoga, CA (US)

(73) Assignee: LITEPOINT CORPORATION, San Jose, CA (US)

( * ) Notice: Subject to any disclaimer, the term of this patent is extended or adjusted under 35 U.S.C. 154(b) by 0 days.

(21) Appl. No.: 17/672,400

(22) Filed: Feb. 15, 2022

(65) Prior Publication Data
US 2023/0258702 A1    Aug. 17, 2023

(51) Int. Cl.
*G01R 29/10* (2006.01)
*H04B 17/10* (2015.01)
*G01R 29/08* (2006.01)

(52) U.S. Cl.
CPC ......... *G01R 29/0878* (2013.01); *G01R 29/10* (2013.01); *H04B 17/102* (2015.01)

(58) Field of Classification Search
CPC ... G01R 29/0878; G01R 29/10; H04B 17/102
See application file for complete search history.

(56) References Cited

U.S. PATENT DOCUMENTS

| | | | |
|---|---|---|---|
| 5,455,588 A * | 10/1995 | Lew | G01S 17/06 342/104 |
| 10,536,226 B1 | 1/2020 | Huynh et al. | H04B 3/46 |
| 10,659,175 B2 | 5/2020 | Huynh et al. | H04B 17/00 |
| 2004/0032363 A1* | 2/2004 | Schantz | G01S 11/06 342/146 |
| 2005/0046608 A1* | 3/2005 | Schantz | G01S 11/06 342/146 |
| 2006/0267833 A1* | 11/2006 | Langford | G01S 5/02524 342/174 |
| 2009/0280742 A1* | 11/2009 | Schantz | H04B 5/02 455/41.1 |
| 2020/0021369 A1* | 1/2020 | Huynh | H04B 17/102 |

OTHER PUBLICATIONS

U.S. Appl. No. 17/471,868, filed Sep. 10, 2021, M-C Huynh.

* cited by examiner

*Primary Examiner* — Jermele M Hollington
*Assistant Examiner* — Suresh K Rajaputra
(74) *Attorney, Agent, or Firm* — Burns & Levinson LLP

(57) ABSTRACT

Systems and methods are provided for systems and methods for using pulsed radio frequency (RF) signals to stimulate one or more modulated scattering probes (MSPs) to enable measurements of distance to and planarity of a surface of a wireless device under test (DUT).

20 Claims, 15 Drawing Sheets

Case for $\Delta\theta_{meas} \geq \Delta\theta_{est}$

Case for $\Delta\theta_{meas} < \Delta\theta_{est}$

|  | f1 | | f2 | |
|---|---|---|---|---|
| dest (mm) | dmeas_1 (mm) | dmeas_2 (mm) | dmeas_1 (mm) | dmeas_2 (mm) |
| 100.0 | 105.5 | 97.8 | 98.2 | 105.7 |
| 101.0 | 105.5 | 97.8 | 98.2 | 105.7 |
| 102.0 | 105.5 | 97.8 | 98.2 | 105.7 |
| 103.0 | 105.5 | 97.8 | 98.2 | 105.7 |
| 104.0 | 105.5 | 97.8 | 98.2 | 105.7 |
| 105.0 | 105.5 | 97.8 | 98.2 | 98.2 |
| 106.0 | 105.5 | 113.2 | 105.7 | 113.2 |
| 107.0 | 105.5 | 113.2 | 105.7 | 113.2 |
| 108.0 | 113.2 | 105.5 | 105.7 | 113.2 |
| 109.0 | 113.2 | 105.5 | 105.7 | 113.2 |
| 110.0 | 113.2 | 105.5 | 105.7 | 113.2 |
| 111.0 | 113.2 | 105.5 | 105.7 | 113.2 |
| 112.0 | 113.2 | 105.5 | 105.7 | 113.2 |
| 113.0 | 113.2 | 120.9 | 113.2 | 105.7 |
| 114.0 | 113.2 | 120.9 | 113.2 | 120.7 |
| 115.0 | 120.9 | 113.2 | 113.2 | 120.7 |
| 116.0 | 120.9 | 113.2 | 113.2 | 120.7 |
| 117.0 | 120.9 | 113.2 | 113.2 | 120.7 |
| 118.0 | 120.9 | 113.2 | 113.2 | 120.7 |
| 119.0 | 120.9 | 113.2 | 113.2 | 120.7 |
| 120.0 | 120.9 | 113.2 | 120.7 | 113.2 |
| 121.0 | 120.9 | 128.6 | 120.7 | 128.2 |
| 122.0 | 120.9 | 128.6 | 120.7 | 128.2 |
| 123.0 | 120.9 | 128.6 | 120.7 | 128.2 |
| 124.0 | 128.6 | 120.9 | 120.7 | 128.2 |
| 125.0 | 128.6 | 120.9 | 120.7 | 128.2 |

The two sets having a common value within the condition [113.2-7.5, 113.2+7.5[. That common value is the measured distance that is closed to the actual distance $d_{true}$.

FIG. 6

| dest (mm) | f1 | | f2 | |
|---|---|---|---|---|
| | dmeas_1 (mm) | dmeas_2 (mm) | dmeas_1 (mm) | dmeas_2 (mm) |
| 100.0 | 105.5 | 97.8 | 98.2 | 105.7 |
| 101.0 | 105.5 | 97.8 | 98.2 | 105.7 |
| 102.0 | 105.5 | 97.8 | 98.2 | 105.7 |
| 103.0 | 105.5 | 97.8 | 98.2 | 105.7 |
| 104.0 | 105.5 | 97.8 | 98.2 | 105.7 |
| 105.0 | 105.5 | 97.8 | 105.7 | 98.2 |
| 106.0 | 105.5 | 113.2 | 105.7 | 113.2 |
| 107.0 | 105.5 | 113.2 | 105.7 | 113.2 |
| 108.0 | 113.2 | 105.5 | 105.7 | 113.2 |
| 109.0 | 113.2 | 105.5 | 105.7 | 113.2 |
| 110.0 | 113.2 | 105.5 | 105.7 | 113.2 |
| 111.0 | 113.2 | 105.5 | 105.7 | 113.2 |
| 112.0 | 113.2 | 105.5 | 105.7 | 113.2 |
| 113.0 | 113.2 | 105.5 | 113.2 | 105.7 |
| 114.0 | 113.2 | 120.9 | 113.2 | 120.7 |
| 115.0 | 113.2 | 120.9 | 113.2 | 120.7 |
| 116.0 | 120.9 | 113.2 | 113.2 | 120.7 |
| 117.0 | 120.9 | 113.2 | 113.2 | 120.7 |
| 118.0 | 120.9 | 113.2 | 113.2 | 120.7 |
| 119.0 | 120.9 | 113.2 | 113.2 | 120.7 |
| 120.0 | 120.9 | 113.2 | 120.7 | 113.2 |
| 121.0 | 120.9 | 128.6 | 120.7 | 128.2 |
| 122.0 | 120.9 | 128.6 | 120.7 | 128.2 |
| 123.0 | 120.9 | 128.6 | 120.7 | 128.2 |
| 124.0 | 128.6 | 120.9 | 120.7 | 128.2 |
| 125.0 | 128.6 | 120.9 | 120.7 | 128.2 |

FIG. 9A

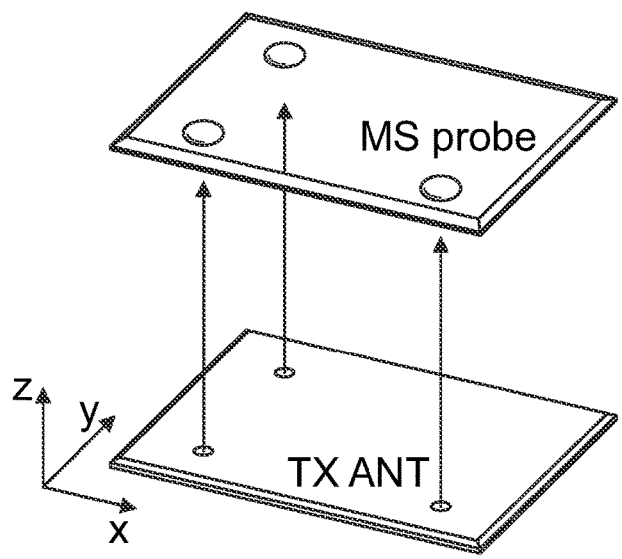
FIG. 12A
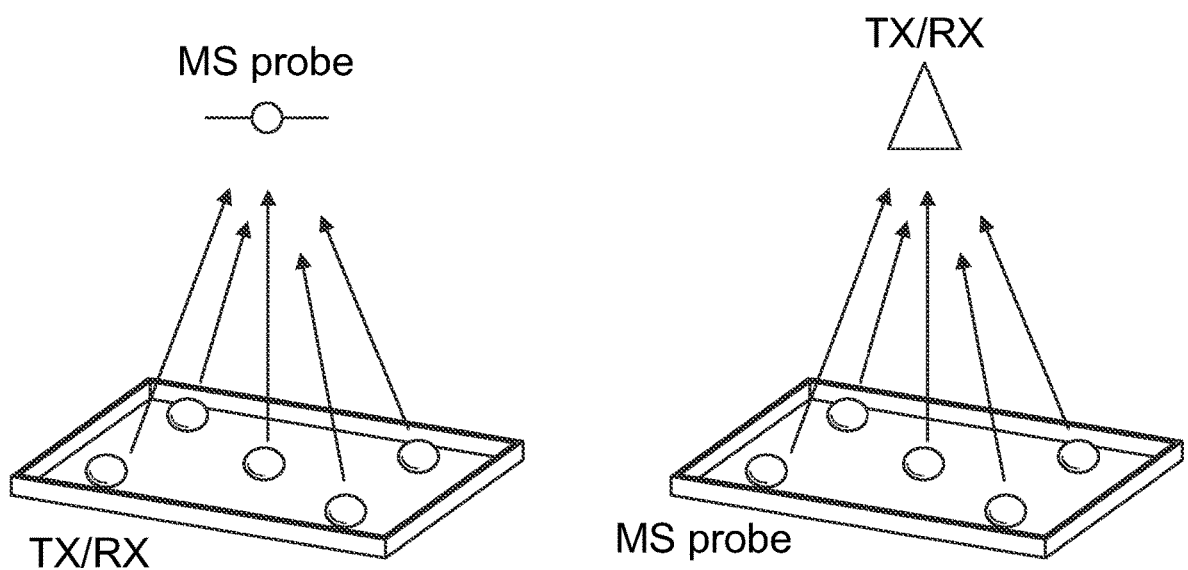
FIG. 12B
FIG. 12C

SYSTEM AND METHOD FOR USING PULSED RADIO FREQUENCY (RF) SIGNALS AND A MODULATED SCATTERING PROBE (MSP) TO ENABLE MEASUREMENTS OF DISTANCE TO AND PLANARITY OF A SURFACE OF A DEVICE UNDER TEST (DUT)

BACKGROUND

The present invention relates to systems and methods for using pulsed radio frequency (RF) signals to stimulate a modulated scattering probe (MSP), and in particular by doing so enabling measurements of distance to and planarity of a surface of a wireless device under test (DUT).

This distance is used in a back-propagation transform equation to compute NFs at the surface of the antenna aperture. At millimeter-wave frequencies, it is important to know this distance accurately to obtain accurate results after this mathematical transform. It is also important to ensure that the NF measurement plane is parallel to the aperture plane of the testing radiator, such as a planar antenna array. The further away from parallel the NF measurement plane and aperture of the antenna array are the greater amount of error results in processing of the NFs.

Some current techniques include use of a physical measuring device, such as a ruler or measuring tape, to visually estimate (or "eye-ball") the distance between the MSP array and antenna aperture. This introduces potential errors from inaccuracies on the part of both the physical measuring device and visual estimation skill of the user, which are likely to be significant in the context of RF signal wavelengths at millimeter-wave frequencies. Other current techniques include use of a modulated laser and phase delay measurement technique. These require complex circuitry built on to the NF system, often with additional components that can interfere with NF measurements.

Accordingly, significant advantages may be realized with implementation of a new method for measuring accurately the orthogonal distance between the surface containing the modulated scattering probe and the aperture of the transmitting antenna on the device under test, and checking if the measurement plane is parallel to the radiating aperture plane using existing RF transmission signals and a modulated scattering technique.

SUMMARY

Systems and methods are provided for systems and methods for using pulsed radio frequency (RF) signals to stimulate one or more modulated scattering probes (MSPs) to enable measurements of distance to and planarity of a surface of a wireless device under test (DUT).

In accordance with an exemplary embodiment, {BISTATIC APPARATUS} An apparatus including a system for using pulsed radio frequency (RF) signals and a modulated scattering probe (MSP) to enable measurements of distance to and planarity of a surface of a device under test (DUT), comprises: a pulsed RF signal transceiver to provide first, second, third and fourth pulsed RF transmit signals and receive first, second, third and fourth pulsed RF scatter signals related to the first, second, third and fourth pulsed RF transmit signals, respectively; a first electromagnetic transducer element, coupled to the pulsed RF signal transceiver, to respond to first, second, third and fourth pulsed electromagnetic scatter waves by providing the first, second, third and fourth pulsed RF scatter signals, respectively; a MSP, disposed between the DUT and the first electromagnetic transducer element, to respond to first, second, third and fourth pulsed electromagnetic transmit waves by emitting the first, second, third and fourth pulsed electromagnetic scatter waves, respectively; a second electromagnetic transducer element, coupled to the pulsed RF signal transceiver, to respond to the first, second, third and fourth pulsed RF transmit signals by emitting the first and second pulsed electromagnetic transmit waves from a surface of a support member supporting the DUT at a first distance from the MSP, and emitting the third and fourth pulsed electromagnetic transmit waves from a surface of the DUT at a second distance from the MSP; and processing circuitry, coupled to the pulsed RF signal transceiver, comprising memory capable of storing a plurality of executable instructions, and one or more processors operably coupled to the memory and responsive to one or more of the plurality of executable instructions by causing the pulsed RF signal transceiver to generate the first, second, third and fourth pulsed RF transmit signals, wherein the first and second pulsed RF transmit and scatter signals include mutually distinct first and second carrier signal frequencies having first and second wavelengths, respectively, and the third and fourth pulsed RF transmit and scatter signals include the mutually distinct first and second carrier signal frequencies having the first and second wavelengths, respectively, processing the received first and third pulsed RF scatter signals to provide first and third pluralities of phase data related to first phase difference between the first and third pulsed electromagnetic scatter waves, processing the received second and fourth pulsed RF scatter signals to provide second and fourth pluralities of phase data related to a second phase difference between the second and fourth pulsed electromagnetic scatter waves, and processing the first, second, third and fourth pluralities of phase data to compute the second distance from the surface of the DUT to the MSP.

In accordance with another exemplary embodiment, {BISTATIC METHOD} A method for using pulsed radio frequency (RF) signals and a modulated scattering probe (MSP) to enable measurements of distance to and planarity of a surface of a device under test (DUT), comprises: emitting first, second, third and fourth pulsed RF transmit signals; receiving first, second, third and fourth pulsed RF scatter signals related to the first, second, third and fourth pulsed RF transmit signals, respectively; responding, with a first electromagnetic transducer element, to first, second, third and fourth pulsed electromagnetic scatter waves by providing the first, second, third and fourth pulsed RF scatter signals, respectively; responding, with a MSP disposed between the DUT and the first electromagnetic transducer element, to first, second, third and fourth pulsed electromagnetic transmit waves by emitting the first, second, third and fourth pulsed electromagnetic scatter waves, respectively; responding, with a second electromagnetic transducer element, to the first, second, third and fourth pulsed RF transmit signals by emitting the first and second pulsed electromagnetic transmit waves from a surface of a support member supporting the DUT at a first distance from the MSP, and emitting the third and fourth pulsed electromagnetic transmit waves from a surface of the DUT at a second distance from the MSP; and processing a plurality of stored executable instructions and responding thereto by generating the first, second, third and fourth pulsed RF transmit signals, wherein the first and second pulsed RF transmit and scatter signals include mutually distinct first and second carrier signal frequencies having first and second wavelengths, respectively, and the third and fourth pulsed RF transmit and scatter signals include the mutually distinct first and second carrier signal frequencies having the first and second wavelengths, respectively, processing the received first and third pulsed RF scatter signals to provide first and third pluralities of phase data related to first phase difference between the first and third pulsed electromagnetic scatter waves, processing the received second and fourth pulsed RF scatter signals to provide second and fourth pluralities of phase data related to a second phase difference between the second and fourth pulsed electromagnetic scatter waves, and processing the first, second, third and fourth pluralities of phase data to compute the second distance from the surface of the DUT to the MSP.

In accordance with another exemplary embodiment, {MONOSTATIC APPARATUS} An apparatus including a system for using radio frequency (RF) pulsed signals and a modulated scattering probe (MSP) to enable measurements of distance to and planarity of a surface of a device under test (DUT), comprises: a pulsed RF signal transceiver to provide first, second, third and fourth pulsed RF transmit signals and receive first, second, third and fourth pulsed RF scatter signals related to the first, second, third and fourth pulsed RF transmit signals, respectively; at least one electromagnetic transducer element, coupled to the pulsed RF signal transceiver, to respond to first, second, third and fourth pulsed electromagnetic scatter waves by providing the first, second, third and fourth pulsed RF scatter signals, respectively, and respond to the first, second, third and fourth pulsed RF transmit signals by emitting the first and second pulsed electromagnetic transmit waves from a surface of a support member supporting the DUT and emitting the third and fourth pulsed electromagnetic transmit waves from a surface of the DUT; a MSP, disposed at a first distance from the surface of the support member and at a second distance from the surface of the DUT, to respond to the first, second, third and fourth pulsed electromagnetic transmit waves by emitting the first, second, third and fourth pulsed electromagnetic scatter waves, respectively; processing circuitry coupled to the pulsed RF signal transceiver and comprising memory capable of storing a plurality of executable instructions, and one or more processors operably coupled to the memory and responsive to one or more of the plurality of the executable instructions by causing the pulsed RF signal transceiver to generate the first, second, third and fourth pulsed RF transmit signals, wherein the first and second pulsed RF transmit and scatter signals include mutually distinct first and second carrier signal frequencies having first and second wavelengths, respectively, and the third and fourth pulsed RF transmit and scatter signals include the mutually distinct first and second carrier signal frequencies having the first and second wavelengths, respectively, processing the received first and third pulsed RF scatter signals to provide first and third pluralities of phase data related to first phase difference between the first and third pulsed electromagnetic scatter waves, processing the received second and fourth pulsed RF scatter signals to provide second and fourth pluralities of phase data related to a second phase difference between the second and fourth pulsed electromagnetic scatter waves, and processing the first, second, third and fourth pluralities of phase data to compute the second distance from the surface of the DUT to the MSP.

In accordance with another exemplary embodiment, {MONOSTATIC METHOD} A method for using radio frequency (RF) pulsed signals and a modulated scattering probe (MSP) to enable measurements of distance to and planarity of a surface of a device under test (DUT), comprises: emitting first, second, third and fourth pulsed RF transmit signals; receiving first, second, third and fourth pulsed RF scatter signals related to the first, second, third and fourth pulsed RF transmit signals, respectively; responding, with at least one electromagnetic transducer element, to first, second, third and fourth pulsed electromagnetic scatter waves by providing the first, second, third and fourth pulsed RF scatter signals, respectively; responding, with the at least one electromagnetic transducer element, the first, second, third and fourth pulsed RF transmit signals by emitting the first and second pulsed electromagnetic transmit waves from a surface of a support member supporting the DUT and emitting the third and fourth pulsed electromagnetic transmit waves from a surface of the DUT; responding, with a MSP disposed at a first distance from the surface of the support member and at a second distance from the surface of the DUT, to the first, second, third and fourth pulsed electromagnetic transmit waves by emitting the first, second, third and fourth pulsed electromagnetic scatter waves, respectively; and processing a plurality of stored executable instructions and responding thereto by causing the pulsed RF signal transceiver to generate the first, second, third and fourth pulsed RF transmit signals, wherein the first and second pulsed RF transmit and scatter signals include mutually distinct first and second carrier signal frequencies having first and second wavelengths, respectively, and the third and fourth pulsed RF transmit and scatter signals include the mutually distinct first and second carrier signal frequencies having the first and second wavelengths, respectively, processing the received first and third pulsed RF scatter signals to provide first and third pluralities of phase data related to first phase difference between the first and third pulsed electromagnetic scatter waves, processing the received second and fourth pulsed RF scatter signals to provide second and fourth pluralities of phase data related to a second phase difference between the second and fourth pulsed electromagnetic scatter waves, and processing the first, second, third and fourth pluralities of phase data to compute the second distance from the surface of the DUT to the MSP.

BRIEF DESCRIPTION OF THE DRAWINGS

FIG. 6 depicts verification computations enabling measurements in accordance with exemplary embodiments.

FIGS. 9A-9B depict further steps for implementation of an algorithm enabling measurements in accordance with exemplary embodiments.

FIGS. 12A-12C depict use of modulated scattering (MS) probes for testing planarity of a surface of a DUT in accordance with exemplary embodiments.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed. Moreover, to the extent that the figures illustrate diagrams of the functional blocks of various embodiments, the functional blocks are not necessarily indicative of the division between hardware circuitry.

As discussed in more detail below, systems and methods in accordance with exemplary embodiments use pulsed radio frequency (RF) signals and a modulated scattering probe (MSP) to enable measurements of distance to and planarity of a surface of a device under test (DUT). Such systems and methods use existing system components to obtain accurate distance measurement between the DUT and modulated probe array by advantageously using the existing modulated probe(s) to obtain accurate phase measurement right at the probe position. Such measurements are simplified and fast since they need only phase measurements at two different frequencies and at two positions (e.g., a reference position and the position of the DUT). Further, determining accurate distance results from such phase measurements does not require any initial estimation or "guesswork" since the ultimate solution of the absolute distance is unique. Accordingly, potential applications for such systems and methods may be more universal.

Figure 1:
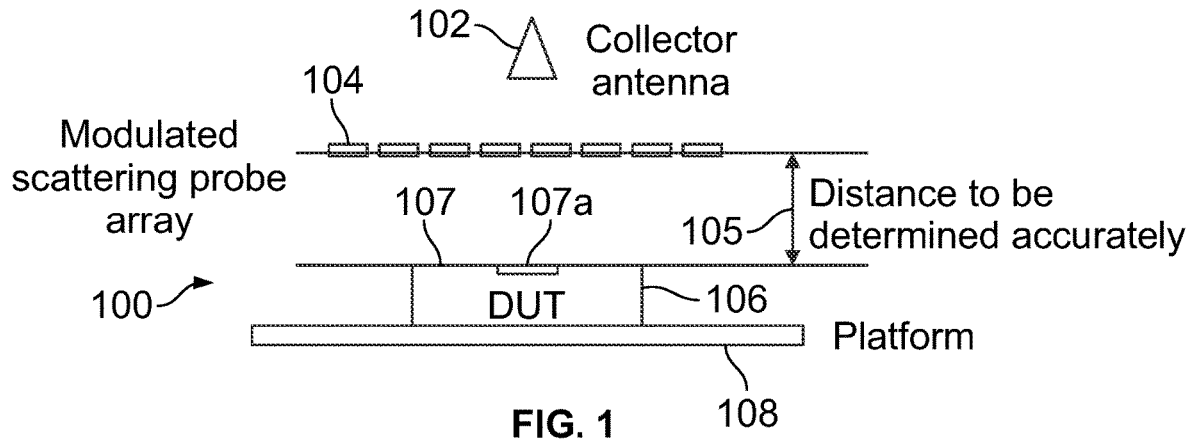
FIG. 1 depicts the distance to a surface of a device under test (DUT) to be measured in accordance with exemplary embodiments.

Referring to FIG. 1, a near-field (NF) over-the-air (OTA) testing environment 100 contained within an electromagnetically shielded chamber (not shown) performs measurements of complex NFs received by a collector antenna 102 positioned at a nominally predetermined distance 105 away from a transmit antenna 107a on a planar surface 107 of a DUT 106. The platform 108 upon which the DUT 106 is situated and the MSP array 104 are at known positions by design and construction of the test environment 100.

Figure 2:
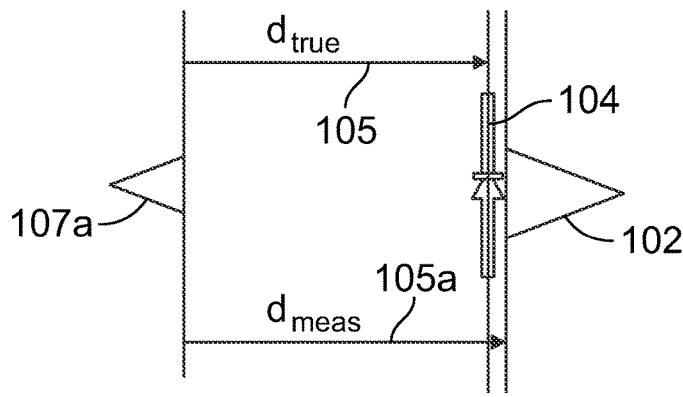
FIG. 2 depicts distances related to a surface of a DUT in accordance with current measurement techniques.

Referring to FIG. 2, as noted above, current techniques using RF signals can measure phase delay between the collector 102 and transmit 107a antennas, which may then be converted to a measured distance (dmeas) 105a. However, in a NF measurement system using a MSP array 104, an accurate measurement of the true orthogonal distance (dtrue) 105 between the surface of the MSP array 104 and the DUT transmit antenna 107a would require the collector antenna 102 to be coplanar with the surface of the MSP array 104. However, this is not feasible unless the MSP array 104 is removed, thereby potentially introducing more measurement uncertainty and/or inaccuracy.

Figure 3:
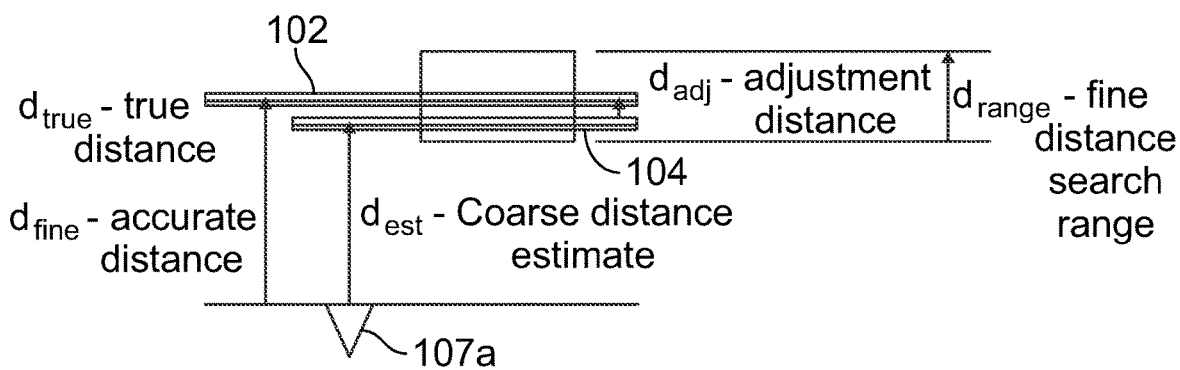
FIG. 3 depicts parameter definitions for measurements in accordance with exemplary embodiments.

Referring to FIG. 3, in accordance with exemplary embodiments, such distance measurement may be achieved by refining an approximate distance obtained from a coarse distance estimate (e.g., using a ruler) using relative phase measurements at a reference distance and the distance at where the antenna 102 aperture is placed. (As discussed in more detail below, this coarse distance needs to be estimated within a range defined by the operating frequency and related to one cycle of the signal phase.) This relative phase may then be converted into a relative adjustment distance value (dadj) and used to adjust the coarse distance estimate (dest) to a more accurate fine distance (dfine), which is closer to the actual, or true, distance (dtrue).

Figure 4:
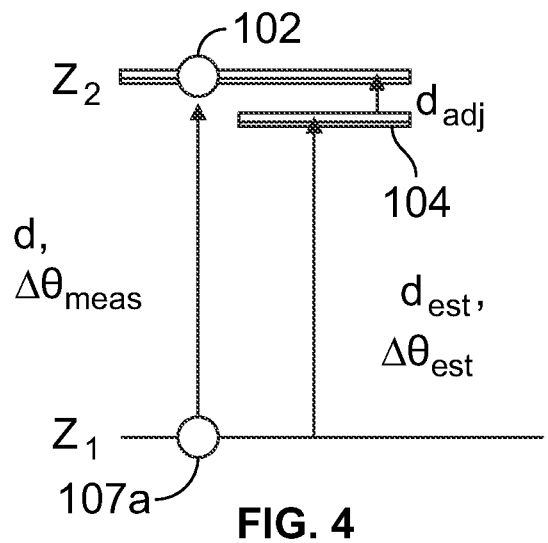
FIG. 4 depicts development of computations enabling measurements in accordance with exemplary embodiments.

Referring to FIG. 4, in accordance with exemplary embodiments, phases at two positions z1, z2, (coincident with the DUT antenna 107a and collector antenna 102 apertures) are measured to define a measured phase difference $\Delta\theta$meas, which is wrapped within range $[0,2\pi]$. With the resulting estimated distance, an estimated phase difference $\Delta\theta$est can be computed from the same reference position z1. This phase difference is also wrapped within $[0, 2\pi]$:

$$\Delta\theta\text{est} = \text{mod}(2\pi/\lambda * \text{dest}, 2\pi) \quad (1)$$

Figure 5A:
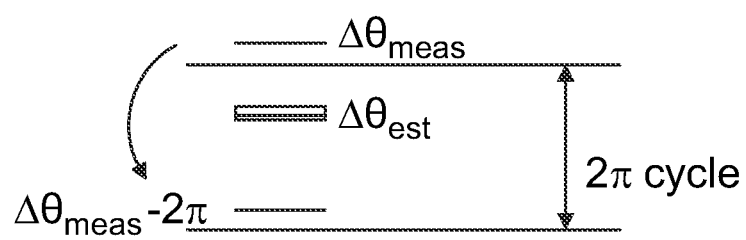
FIGS. 5A-5B depict further development of computations enabling measurements in accordance with exemplary embodiments.
Figure 5B:
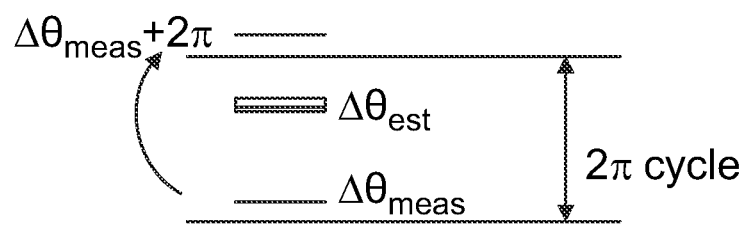

Referring to FIGS. 5A-5B, in accordance with exemplary embodiments, when comparing the measured $\Delta\theta$meas and estimated $\Delta\theta$est phase differences to compute the phase to be adjusted to the delta phase estimate to find the actual distance dtrue, there are two possible solutions:

$$\Delta\theta\text{adj} = \Delta\theta\text{meas} - \Delta\theta\text{est} \quad (2a)$$

$$\Delta\theta meas - \Delta\theta est - 2\pi s \quad (2b)$$

where $s = \text{sign}(\Delta\theta meas - \Delta\theta est)$ $= +1$ if $\Delta\theta meas \geq \Delta\theta est$ $= -1$ if $\Delta\theta meas < \Delta\theta est$ Results from equations (2a)-(2b) may be ambiguous due to their two solutions. To resolve this ambiguity, phase differences $\Delta\theta$adj,1(f1), $\Delta\theta$adj,2(f2) at two corresponding frequencies f1, f2 may be determined. Then, by converting phase to distance, the measured distance dmeas may be derived for each frequency f1, f2:

$$d1(f1) = \text{dest} + \Delta d\text{meas},1(f1) \quad (3a)$$

$$d2(f2) = \text{dest} + \Delta d\text{meas},2(f2) \quad (3b)$$

where $\Delta d\text{meas},1(f1) = \Delta\theta\text{adj},1/2\pi * \lambda 1 = \Delta\theta\text{adj},1/2\pi * c/f1$ (4a)

$\Delta d\text{meas},2(f2) = \Delta\theta\text{adj},2/2\pi * \lambda 2 = \Delta\theta\text{adj},2/2\pi * c/f2$ (4b)

Equations (3a)-(3b) have two values for each frequency. A unique solution for the measured distance is the value that is common to the two frequency sets. The condition to have this common value for both frequency sets is that the estimated distance dest should satisfy the following boundary condition:

$$\text{dest} = [\text{dtrue} - \min(\lambda 1, \lambda 2), \text{dtrue} + \min(\lambda 1, \lambda 2)] \quad (5)$$

Finding the condition needed may be achieved by again applying equations (2a)-(2b), (3a)-(3b) and (4a)-(4b). For example, equations (3a)-(3b) may be rewritten using equations (2a)-(2b) and (4a)-(4b) as follows:

$$d1(f1) = \text{dest} + \Delta d\text{meas},1(f1) = \text{dest} + \Delta\theta\text{adj},1/2\pi * \lambda 1$$

$$d2(f2) = \text{dest} + \Delta d\text{meas},2(f2) = \text{dest} + \Delta\theta\text{adj},2/2\pi * \lambda 2$$

where $\Delta\theta adj = \Delta\theta meas - \Delta\theta est$ $= \Delta\theta meas - \Delta\theta est - 2\pi s$ $s = \text{sign}(\Delta\theta meas - \Delta\theta est) = +1$ if $\Delta\theta meas \geq \Delta\theta est$ $= -1$ if $\Delta\theta meas < \Delta\theta est$ Since $\Delta\theta$meas and $\Delta\theta$est values are wrapped within $2\pi$, their distance counterparts are wrapped within a wavelength $\lambda$. Hence, these equations may be re-written as follows:

$$d1(\lambda 1) = \text{dest} + \Delta d\text{meas},1(\text{dest}|\lambda 1, \lambda 1) \quad (6a)$$

$$d2(\lambda 2) = \text{dest} + \Delta d\text{meas},2(\text{dest}|\lambda 2, \lambda 2) \quad (6b)$$

where the notations dest|$\lambda$1 and dest|$\lambda$2 are wrapped versions of the distance estimates computed from $\Delta\theta$est in Eq. (1), which is a wrapped phase difference of the absolute distance estimate dest. Hence, $\Delta d$meas is a function of the distance estimate that is bound within a wavelength $\lambda$.

$$d1(\lambda 1) = \text{dest} + \Delta d\text{meas},1|\lambda 1 \quad (7a)$$

$$d2(\lambda 2) = \text{dest} + \Delta d\text{meas},2|\lambda 2 \quad (7b)$$

Each $\Delta d$meas,1|2 $\lambda$1|2 in equations (6a)-(6b) gives two solutions:

$$d11(\lambda 1) = \text{dest} + \Delta d1 - \text{dest}|\lambda 1 \quad (8a)$$

$$d12(\lambda 1) = \text{dest} + \Delta d1 - \text{dest}|\lambda 1 - 2\pi s \quad (8b)$$

$$d21(\lambda 2) = \text{dest} + \Delta d2 - \text{dest}|\lambda 2 \quad (8c)$$

$$d22(\lambda 2) = \text{dest} + \Delta d2 - \text{dest}|\lambda 2 - 2\pi s \quad (8d)$$

The condition to find the actual distance is a solution in one frequency set has a matching solution in the other frequency set for a given distance estimate dest:

$$d11(\lambda 1) = d21(\lambda 2)$$

$$d11(\lambda 1) = d22(\lambda 2)$$

$$d12(\lambda 1) = d21(\lambda 2)$$

$$d12(\lambda 1) = d22(\lambda 2) \quad (9)$$

Referring to FIG. 6, in accordance with exemplary embodiments, a verification of equations (9) may be represented in a tabulated form illustrating how and where a common values for the two frequency sets under the boundary condition represented by equation (5). For example, for the following frequencies f1, f2 (and corresponding wavelengths $\lambda$1, $\lambda$2) a common value of the true distance dtrue may be determined as summarized below:

f1=39 GHz ($\lambda$1=7.69 mm)

f2=40 GHz ($\lambda$2=7.50 mm)

dtrue=113.2 mm

Figure 7:
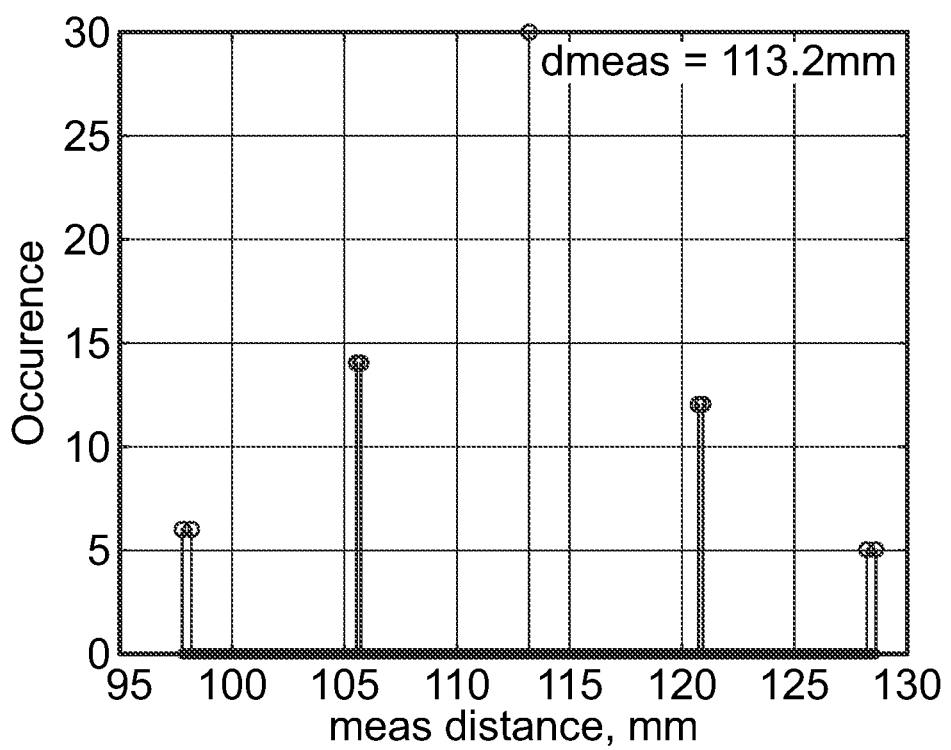
FIG. 7 depicts steps for implementation of an algorithm enabling measurements in accordance with exemplary embodiments.

Referring to FIG. 7, in accordance with exemplary embodiments, from the tabulated results (FIG. 6) it may be seen that the true distance can be determined when the initial distance estimate dest is within the boundary condition around the true distance dtrue.

It may further be seen that an algorithm may be derived that, when implemented, may enable determinations of the true distance dtrue without knowledge a priori of a boundary condition on the distance estimate dest by using a range of distance estimates. For example, if all possible computed values for a range of distance estimates (e.g., all values listed in a table as in FIG. 6) are plotted in a histogram form by counting respective occurrences of each measured distance value, the highest occurrence will identify the true distance dtrue value as depicted here for the example of FIG. 6.

Figure 8A:
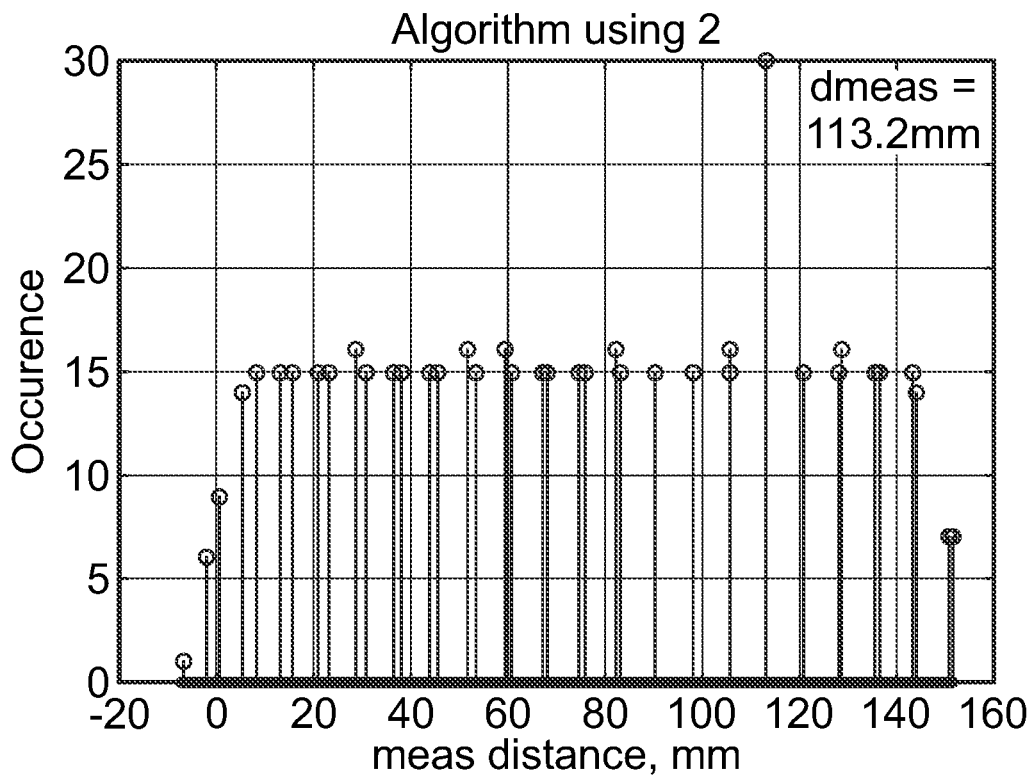
FIGS. 8A-8B depict further steps for implementation of an algorithm enabling measurements in accordance with exemplary embodiments.
Figure 8B:
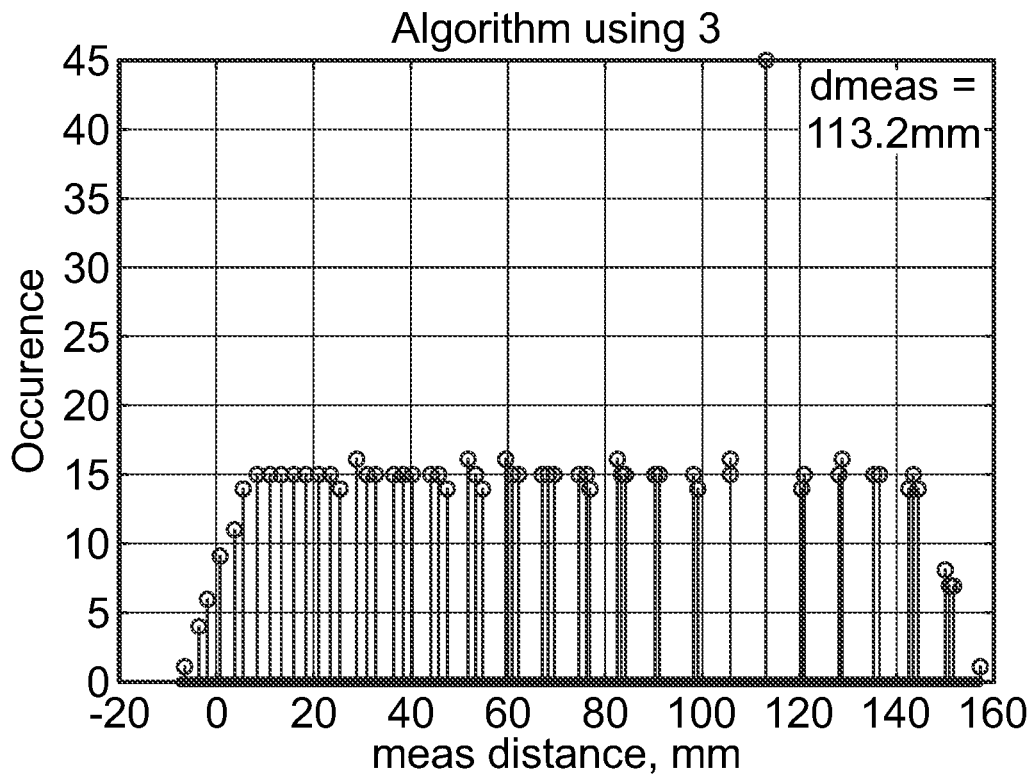

Referring to FIGS. 8A-8B, in accordance with exemplary embodiments, the range of possible real physical distance values within the system may be further expanded, thereby avoiding a need for an initial estimate or guess of the distance estimate dest. As discussed above, it is possible to compute measured distances for a range of all possible distances. For example, assume that the possible true distance in the previous problem can only range from 0 to 150 mm due to physical limitations. The histogram plot using this range with a one mm step is depicted here (FIG. 8A) for a two frequency approach. The distance with the highest number of occurrences is the true distance.

Distance measurement using such an approach may become more universal without the need for knowledge of the boundary condition a priori or an initial distance estimate, while requiring only two phase measurements relative to each other for each frequency. This approach may be further expanded to perform measurements at more than two frequencies. As phase measurements are performed at more frequencies, so too may confidence increase in the results for finding the true distance. For example, as depicted here in (FIG. 8B), increased numbers of occurrences may be seen for a case in which phase measurements are performed at three frequencies.

Figure 9B:
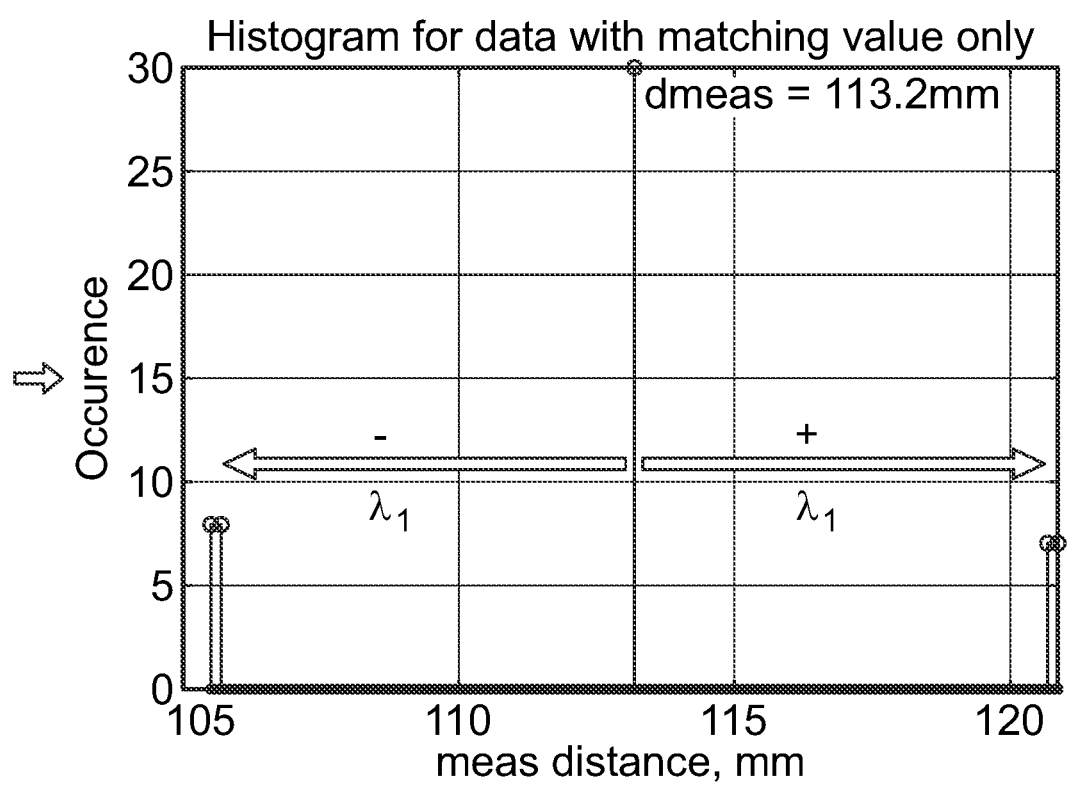

Referring to FIGS. 9A-9B, in accordance with exemplary embodiments, as seen in the table FIG. 6 and reproduced here (FIG. 9A), the computed distance is the actual distance when a solution value from one frequency set (e.g., equation (3a)) has a matching solution value in the other frequency set (e.g., equation (3b)) for the same distance estimate. One may also simply implement this approach to search for this matching value to empirically obtain the actual distance. A histogram plot for the data within the boundary condition where a match is found may be produced as depicted here (FIG. 9B).

Figure 10:
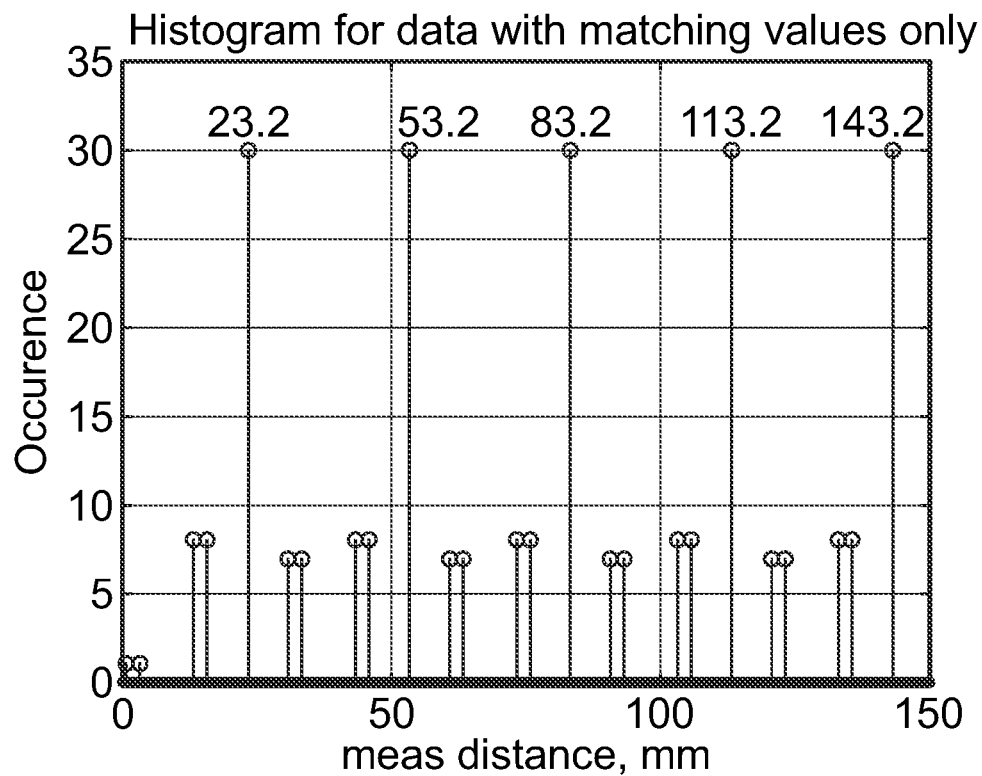
FIG. 10 depicts conditions on chosen frequencies for measurements in accordance with exemplary embodiments.

Referring to FIG. 10, in accordance with exemplary embodiments, one additional condition may be applied to ensure that the matched value is unique. For example, circumstances presenting an issue to the uniqueness of a matched value may be summarized as follows:

$f_1$=30 GHz ($\lambda_1$=10 mm)
$f_2$=40 GHz ($\lambda_2$=7.50 mm)
$d_{true}$=113.2 mm.

A histogram plot showing data with matching values between the two sets at the two frequencies may be produced as depicted here in which there are multiple matched values with the same number of occurrences, thereby resulting in ambiguity in finding the actual distance. However, it can be seen that the matched values between the frequency sets do not occur at a single interval. It can be seen that the occurrences of matched values repeat with a period that is specified by the chosen frequencies.

In the previous example discussed above, with the chosen frequencies $f_1$=39 GHz ($\lambda_1$=7.69 mm) and $f_2$=40 GHz ($\lambda_2$=7.50 mm), the interval length is larger than distance window ([0,150 mm]). Therefore, only a single matched value is shown within this defined distance window. Hence, another beneficial condition would be to require the chosen frequencies to obtain a unique solution for the matching value.

Figure 11:
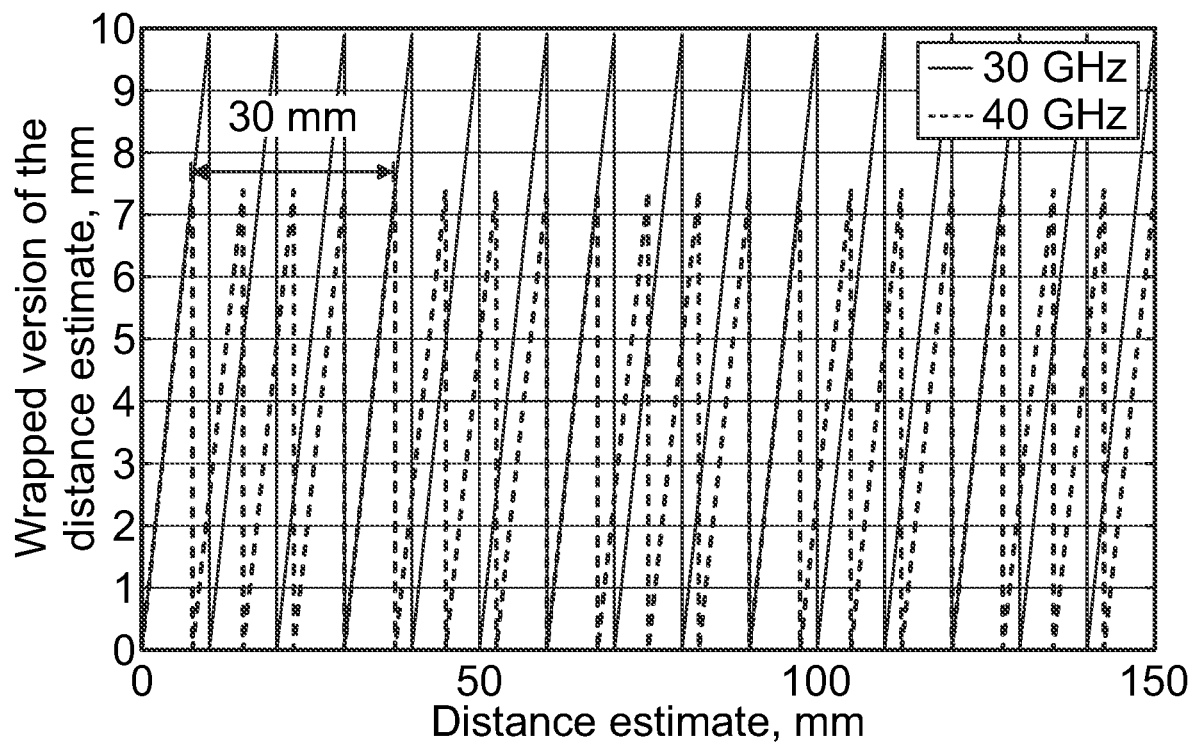
FIG. 11 depicts further conditions on chosen frequencies for measurements in accordance with exemplary embodiments.

Referring to FIG. 11, in accordance with exemplary embodiments, such an additional condition may be determined in the following manner. the periodic interval may be represented as expressed equations (8a)-(8d). The variable that contributes to the periodicity is dest|$\lambda$2, i.e., the wrapped version within a wavelength of the distance estimate. It turns out that dest|$\lambda$1=dest|$\lambda$2 with a periodic interval equal to the least common multiple (LCM) of ($\lambda$1,$\lambda$2). The plot seen here depicts the wrapped version of distance estimate $d_{est}$ as a function of $d_{est}$ for frequencies 30 GHz and 40 GHz, with respective wavelengths of $\lambda_1$=10 mm and $\lambda_1$=7.5 mm. Therefore, LCM($\lambda_1$,$\lambda_2$)=30 mm as shown. In order to avoid having multiple common values of the measured distance, the frequencies may be chosen so that the LCM of their respective wavelengths is larger than the distance estimate range.

A large LCM may be obtained with the two wavelengths having a small difference. However, a limitation on how small this difference may be is dictated by a specified precision of the solution and uncertainty of the measurements. If the two wavelengths give similar solution values within a specified precision, then multiple matched values will show up in the solution with a periodic interval of that wavelength.

As discussed above about theoretical development of computations in accordance with exemplary embodiments, a condition on the antennas used in the measurement to obtain phase values should be satisfied. The equations describing such theoretical development rely on an implicit assumption that either the transmitting source is a single point source, or the transmitting antenna is far enough away from the modulated probe that planar electromagnetic waves arrive at the probe (e.g., as a far-field condition). As well known to those skilled in the art, in a near-field region, phase is not dependent solely on distance between the transmit antenna and the probe, but also dependent on the geometry of the antenna and probe, as well as any mutual coupling. Hence, in a NF case, phase measurements would not produce the correct distance.

In order to keep the far-field distance small, the transmit antenna aperture should be kept small, such as a half-wave antenna design. The modulated probe is generally small as well, such as a half-wavelength or less. For a small aperture, half-wavelength or less, a minimum of two wavelengths may be an acceptable minimum far-field distance since the reactive near-field should be negligible at that distance for small antennas. Hence, this may be considered the limitation of the minimum measured distance.

For example, the modulated probe may be less than a half wavelength and a half-wave patch antenna may be used for transmitting signals. The patch antenna may be designed to transmit at 39 and 40 GHz. This translates to a minimum far-field distance of two wavelengths at 39 GHz, or 15.4 mm, with an acceptable minimum distance placing the DUT at 30-40 mm away from the modulated probe array at millimeter-wave frequencies.

As noted, minimum measurement distance also depends on the transmitting antenna aperture. However, there is a tradeoff between minimum distance and maximum possible distance measurement. Smaller aperture antenna has lower gain and therefore can limit how far it can be placed from the probe. The scattered signal may be too deep into the noise if a low-gain transmitting antenna is too far from the probe.

Referring to FIGS. 12A-12C, in accordance with exemplary embodiments, testing surface planarity requires phase measurements at multiple locations on the surface. There are several ways capture phase at different locations. For example, as depicted in FIG. 12A, multiple transmissions via a transmitter antenna TX ANT with corresponding MSP array probes with boresight alignments. Alternatively, as depicted in FIG. 12B, transmissions via multiple transducers of a transceiver TX/RX to a single MS probe, or as depicted in FIG. 12C, transmission via a single transducer of a transceiver TX/RX to a multiple MS probes.

Using techniques as discussed above to accurately measure distance from MS probes at multiple locations, it is possible to test whether a surface containing the transmitting radiators is parallel to the planar surface containing the MS probes being used in such measurements. Instead of performing measurement at a single location in the xy plane, phase measurements may be done at multiple locations. The TX radiators may be placed within the surface to be tested for planarity. At least four locations should enable achievement of best results for testing surface planarity. Since surface planarity or surface orientation is relative to the surface of the MS probe array it is assumed that the MS probe array is within a planar surface.

Figure 13:
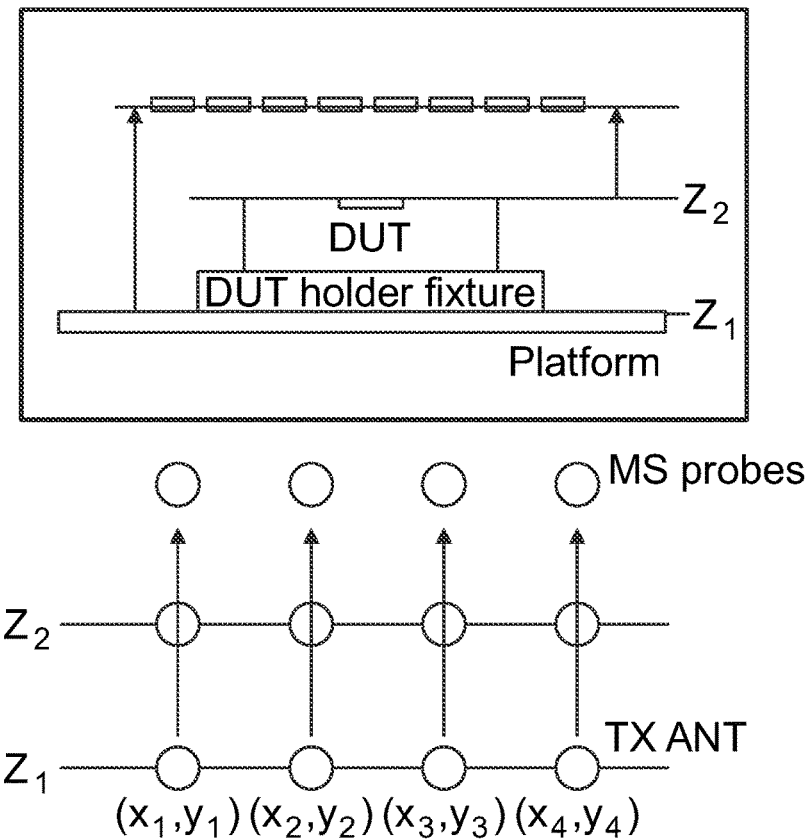
FIG. 13 depicts use of MS probes with boresight alignment for testing planarity of a surface of a DUT in accordance with exemplary embodiments.

Referring to FIG. 13, in accordance with exemplary embodiments, multiple transmissions with corresponding boresight-aligned MSP array probes, as depicted in FIG. 12A, may be used for measurements at four locations within the platform surface at position $z_1$ and DUT surface at position $z_2$ at four surface locations (x1,y1), (x2,y2), (x3,y3), (x4,y4). This will produce two sets of three phase measurements ($\theta z1,1$, $\theta z1,2$, $\theta z1,3$, $\theta z4$) and ($\theta z2,1$, $\theta z2,2$, $\theta z2,3$, $\theta z2,4$), resulting in the two conditions: (1) If the phase values at position $z_1$ are similar (within a known measurement uncertainty), then the surface at the platform $z_1$ is planar and parallel to the MS probe array; and (2) If the phase values at position $z_2$ are similar (within a known measurement uncertainty), then the surface at the DUT array $z_2$ is planar and parallel to the MS probe array.

Figures 14A, 14B:
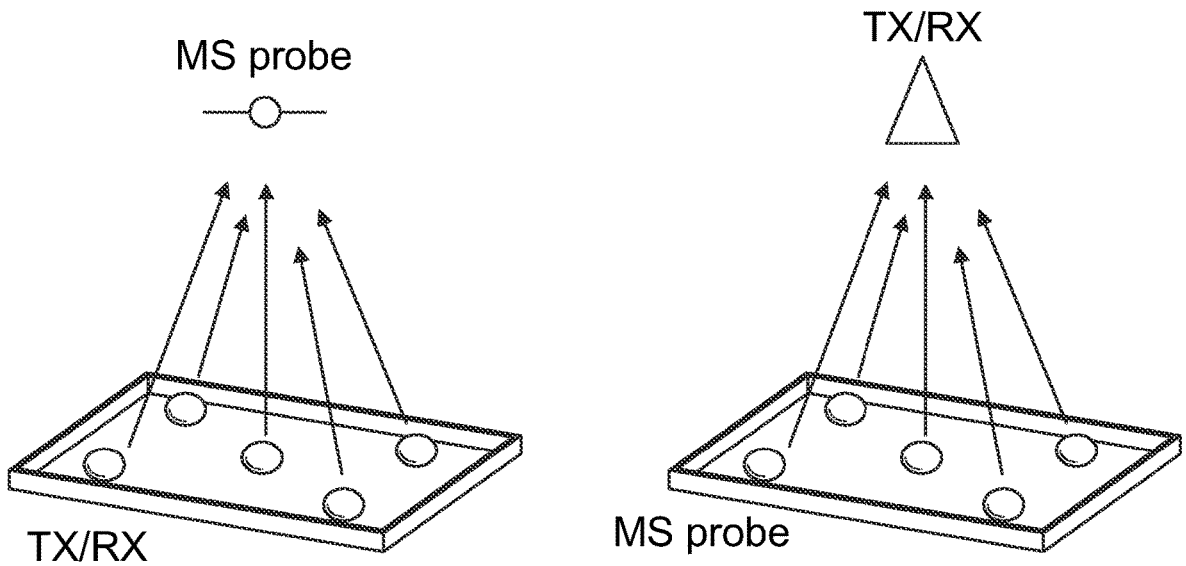
FIGS. 14A-14B depict use of single and multiple radiators and MS probes for testing planarity of a surface of a DUT in accordance with exemplary embodiments.

Referring to FIGS. 14A-14B (as depicted in FIGS. 12B-12C), multiple radiators and a single MS probe or multiple MS probes and a single radiator may be used in accordance with exemplary embodiments as noted above. In the former case, the radiators are placed on a surface of the transceiver TX/RX to be tested. In the latter case, the MS probes are placed on the surface.

Figure 15:
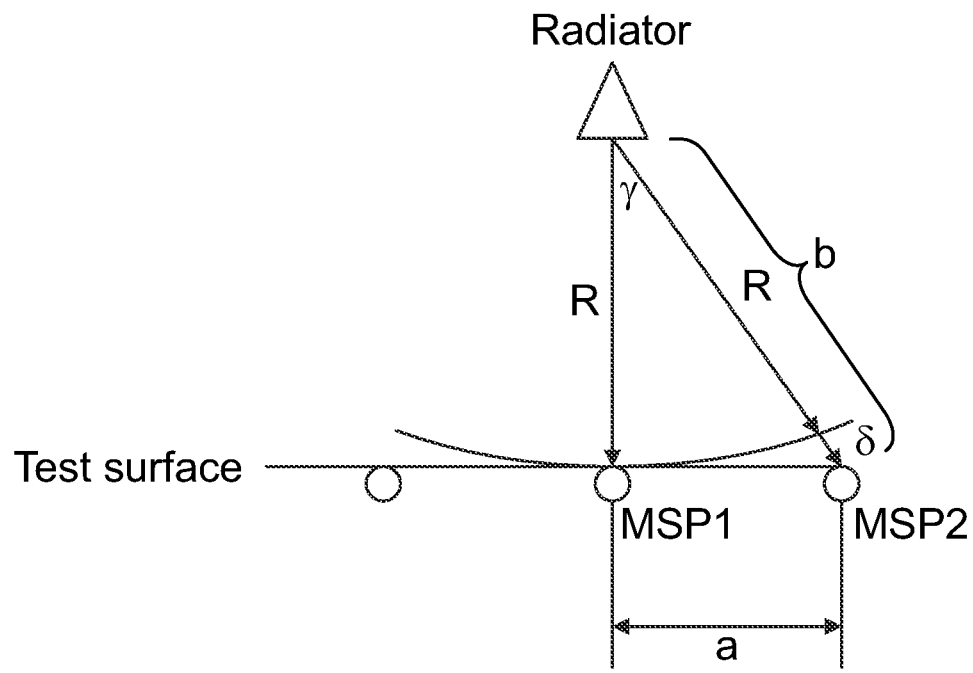
FIG. 15 depicts development of computations for use of a single radiator and multiple MS probes for testing planarity of a surface of a DUT in accordance with exemplary embodiments.

Referring to FIG. 15, in both cases as depicted in FIG. 14, a set of phase values may be measured and processed for surface planarity testing. For example, the case of a single radiator and multiple MS probes may be used for developing the defining equations. The focus is to calculate the phase delay of two probes MSP1, MSP2 receiving a spherical signal wave front coming from a radiator. Note that the resulting equations also apply to the case where we have multiple radiators placed at the testing surface and a single MS probe placed at an orthogonal distance R from that surface.

Applying the relationship between phase and distance, it can be shown that:

$$\theta_1 = \frac{2\pi}{\lambda} R$$
$$\theta_2 = \frac{2\pi}{\lambda} b = \frac{2\pi}{\lambda} \frac{R}{\cos(\gamma)}$$

where $$\gamma = \tan^{-1}\left(\frac{a}{R}\right).$$

The difference in phase becomes $$\Delta\theta = \theta_2 - \theta_1 = \frac{2\pi R}{\lambda}\left(\frac{1}{\cos(\gamma)} - 1\right)$$

Note that $\delta$ can be computed from $$\delta = \frac{\lambda}{2\pi} \Delta\theta$$

With known distances R and a, the phase difference can be computed. If the phase difference computed form the measured phase values $\theta_1$ and $\theta_2$ is similar to the computed one within the measurement uncertainty, then the two probes may be considered as defining a line orthogonal to the boresight direction defined by the Radiator and first prove MSP1. Extending this comparison further to more than three locations, the surface containing those tested locations may be considered as planar and perpendicular to the boresight direction.

The far-field (FF) condition described above for distance measurement also applies to this planarity testing technique. This enables avoiding measurements in a near-field (NF) region where phase may be dependent on coupling effects between the radiator and MS probe and the geometry of both radiator and probe.

Figure 16:
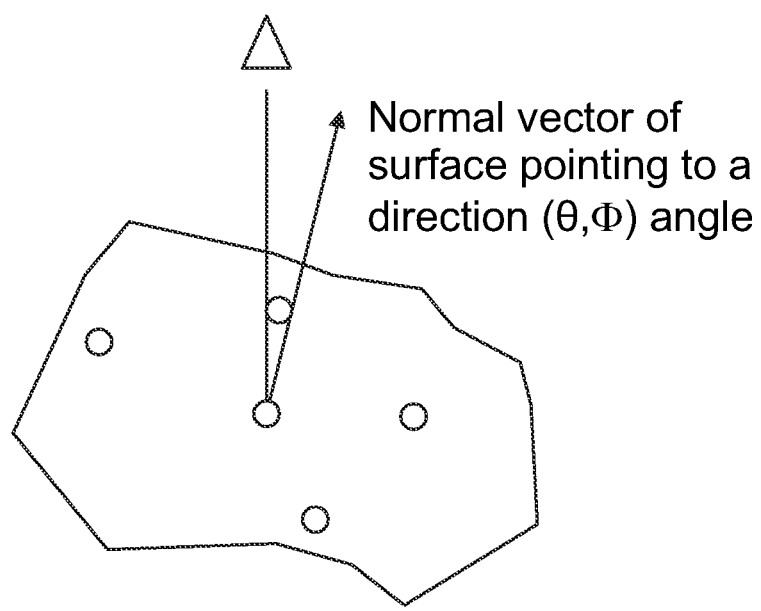
FIG. 16 depicts development of computations determining angular direction of a planar surface of a DUT in accordance with exemplary embodiments.

Referring to FIG. 16, once the phases have been measured at multiple locations within a surface, this planarity test can reveal if the surface is smooth or at least not within a defined set of limits. The measured values may also reveal whether the surface containing the tested locations is angled. With the known (x,y) position of each location and its corresponding measured phase, the three dimensional coordinates of all the points may be calculated. The direction of the normal vector of the tested surface containing those points may then be computed. The assumption is that all the points satisfy the surface equation within a set of limits defined by a measurement uncertainty. As is well known, the three dimensional equation of a plane is ax+by+cz+d=0.

Figure 17A:
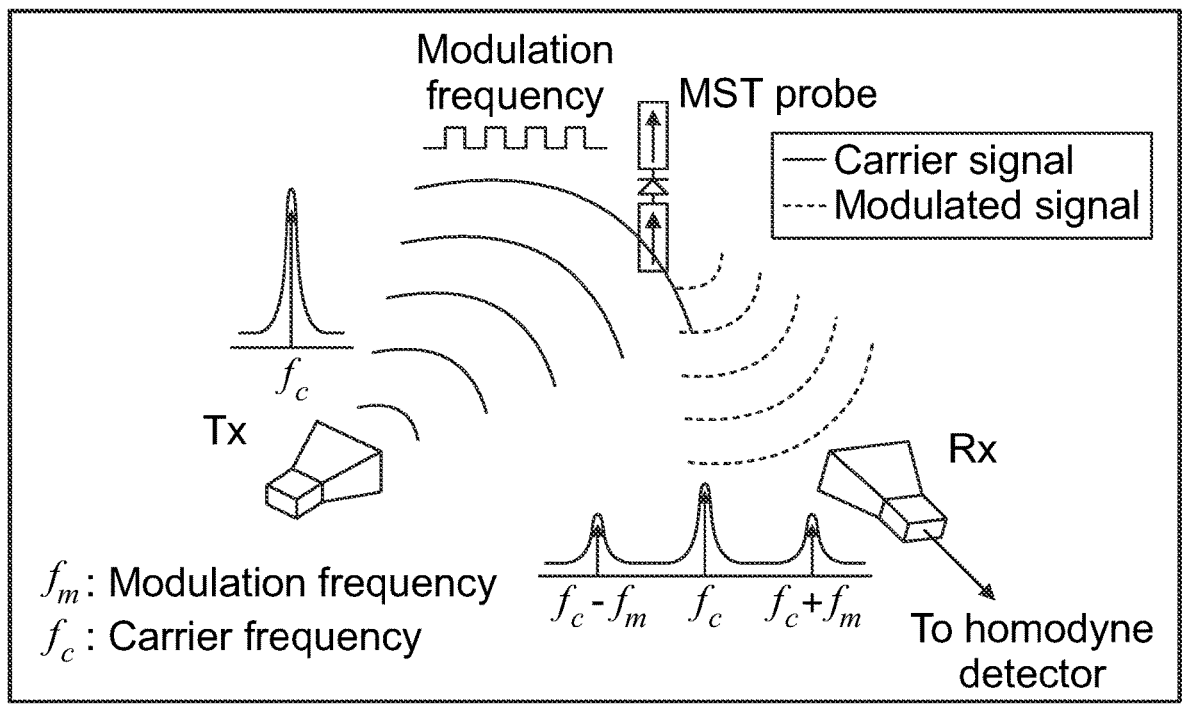
FIGS. 17A-17B depict development of phase measurements for distance and planarity measurements in accordance with exemplary embodiments.
Figure 17B:
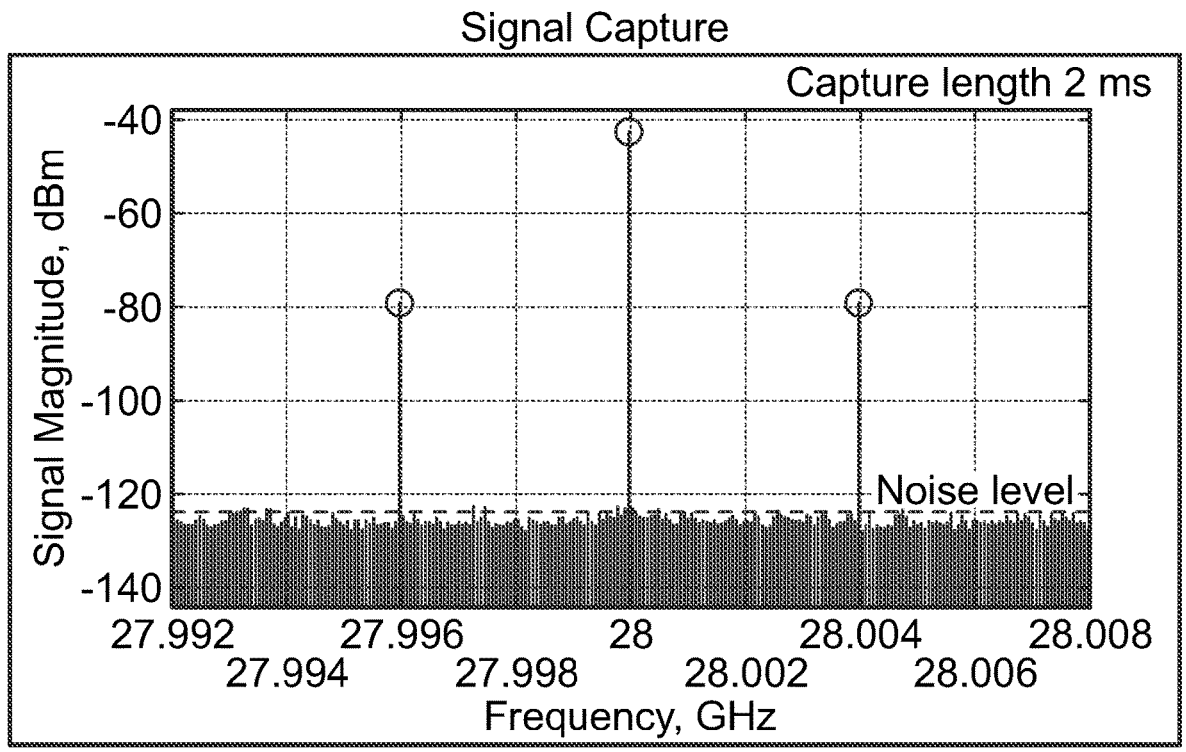

Referring to FIGS. 17A-17B, the technique discussed thus far for measuring distance and planarity testing requires phase measurements. As depicted in FIG. 17A, one possible technique for measuring RF signal phase is known as a modulated scattering technique (MST). As depicted in FIG. 17B, the MST may be used to obtain a complex electromagnetic field of an incoming transmitted signal at the distance away from the modulated scattering probe (MSP). This phase information, as a function of such distance from the transmitting antenna, may be measured.

Numerous examples of modulated scattering probe (MSP) arrays and systems enabling a MST are well known in the art. Particularly advantageous examples may be found in U.S. Pat. Nos. 10,536,226 and 10,659,175, and U.S. patent application Ser. No. 17/471,868, the contents of which are hereby incorporated by reference.

Figure 18A:
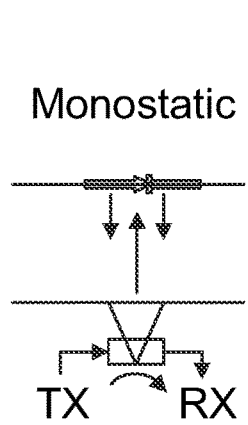
FIGS. 18A-18B depict monostatic and bistatic phase measurements for distance and planarity measurements in accordance with exemplary embodiments.
Figure 18B:
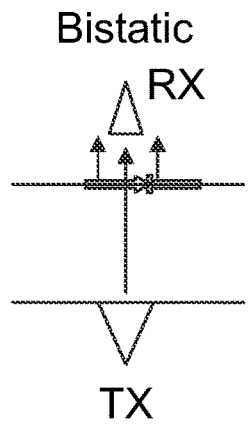

Referring to FIGS. 18A-18B, in accordance with exemplary embodiments, when implementing a MST, there are two techniques for measuring phase: (a) monostatic as depicted in FIG. 18A, and (b) bistatic as depicted in FIG. 18B. In the monostatic technique, the transmitter and receiver antennas are co-located, e.g., at a common position, as they use the same antenna for transmission and reception. In the bistatic technique, the transmitter TX and receiver TX are at different positions with their own respective antennas for transmission and reception.

Figure 19:
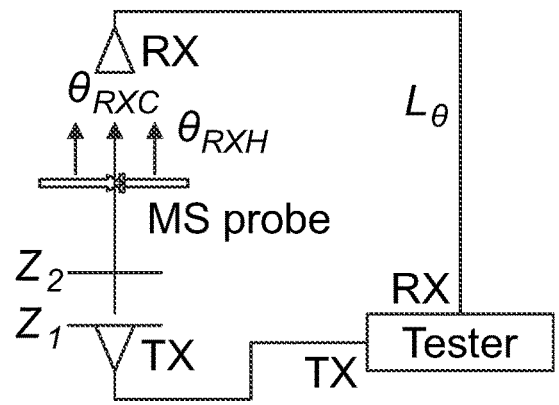
FIG. 19 depicts an example of bistatic phase measurement in accordance with exemplary embodiments.

Referring to FIG. 19, in accordance with exemplary embodiments implementing a bistatic technique, the transmit TX and receive RX antennas are separate antennas. The three phase values are captured by the receiver RX from the transmitter when it is placed at two positions z1, z2 relative to the MS probe. The near-field phase may be computed as follows:

$$\theta_{z_1} = \frac{1}{2}\left(\theta_{RXL,z_1} + \theta_{RXH,z_1}\right) - \theta_{RXC,z_1} - L_\theta$$
$$\theta_{z_2} = \frac{1}{2}\left(\theta_{RXL,z_2} + \theta_{RXH,z_2}\right) - \theta_{RXC,z_2} - L_\theta$$

where $L_\theta$ is the phase delay from the MS probe to the receiver, $\theta_{RXC}$ is the phase of the center signal, and $\theta_{RX\ L\backslash H}$ are the phase of the sideband signals.

The relative phase between the positions z1, z2 is given by:

$$\Delta\theta = \theta_{z_2} - \theta_{z_1}.$$

Because the center signal phase is different for different positions, it is important that the transmitter and receiver be synchronized during the phase captures.

Figure 20:
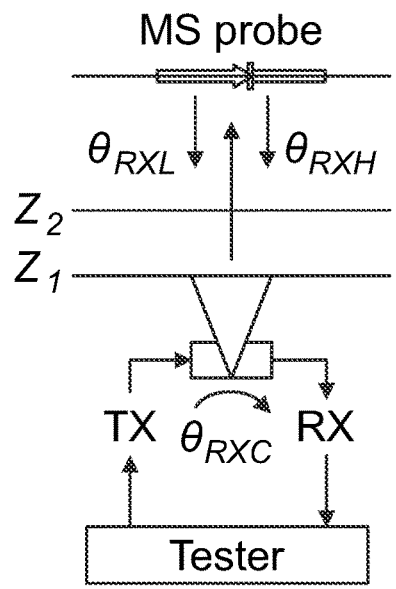
FIG. 20 depicts an example of monostatic phase measurement in accordance with exemplary embodiments.

Referring to FIG. 20, in accordance with exemplary embodiments implementing a monostatic technique, the relative phase of the electromagnetic field between the modulated probe and the TX/RX antenna may be measured. A dual-polarized antenna may be used to capture the center frequency due to port leakage of the antenna and the modulated signals scattered back from the MS probe, and should be oriented in such a way that both polarizations are rotated 45 degrees from the polarization of the MS probe.

Similar to the bistatic method, the three phase values may be captured during reception with the common antenna at two positions z1, z2, with the near-field (NF) phase computed as follows:

$$\theta_{z_1} = \frac{\theta_{RXL,z_1} + \theta_{RXH,z_1}}{4} - \theta_{RXC,z_1} - L_{\theta,z_1}$$

$$\theta_{z_2} = \frac{\theta_{RXL,z_2} + \theta_{RXH,z_2}}{4} - \theta_{RXC,z_2} - L_{\theta,z_2}$$

Note that the phase delay $L_\theta$ from the antenna aperture and the receiver circuitry remains the same regardless of the position of the transmitter. Similarly, the phase of the center signal $\theta_{RXC}$ is also not dependent on the position(s) of the common TX/RX antenna. Therefore, those terms go away when computing the relative phase between the positions z1, z2:

$$\Delta\theta = \theta_{z_2} - \theta_{z_1}$$

Because the phase of the center signal is independent of the TX/RX antenna position, the monostatic technique advantageously avoids a need for synchronization during phase captures.

Figure 21:
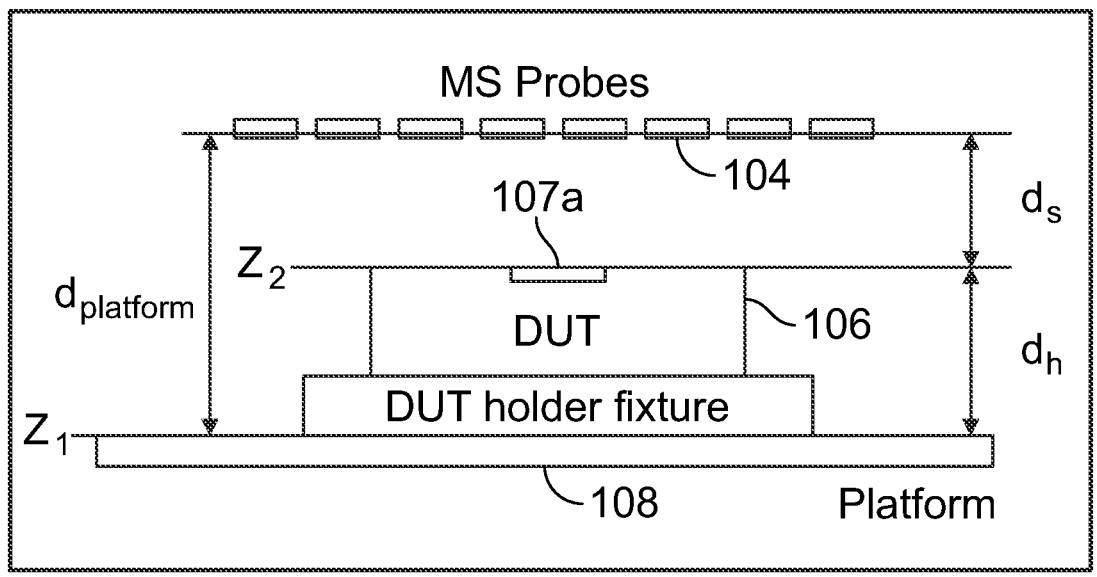
FIG. 21 depicts an implementation of distance measurements in accordance with exemplary embodiments.

Referring to FIG. 21, in accordance with exemplary embodiments, a modulated-scattering (MS) probe array 104 may be used to obtain the measured phase. It may be assumed that the distance $d_{platform}$ between the platform 108 and the MS probe array 104 is known by mechanical design and construction of the test environment. Hence, the goal is to accurately measure the distance $d_s = d_{platform} - d_h$ between the DUT 106 and MS probe array 104.

Figure 22:
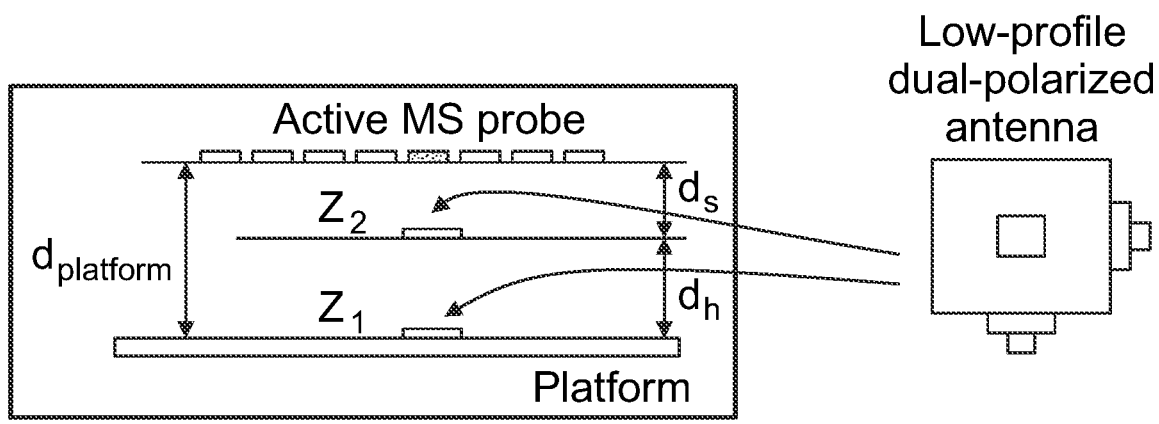
FIG. 22 depicts an implementation of monostatic phase measurement for distance measurements in accordance with exemplary embodiments.

Referring to FIG. 22, in accordance with exemplary embodiments implementing such modulated scattering techniques, two phase measurements may be performed: (1) a $d_{platform}$ (reference phase, $z_1$), and (2) a $d_h$ (phase at DUT location, $z_2$). In this example, a monostatic technique is implemented with a TX/RX antenna at a common location. A simple low-profile dual-polarized antenna for transmitting and receiving the RF signals may be disposed at the two positions z1, z2, and antenna aligned with the MS probes. Once the two measured phases have been captured, techniques as discussed above may be applied to determine the absolute distance $d_h$ and thereby enable determination of the distance $d_s$ between the DUT 106 and MS probe array 104.

Figure 23:
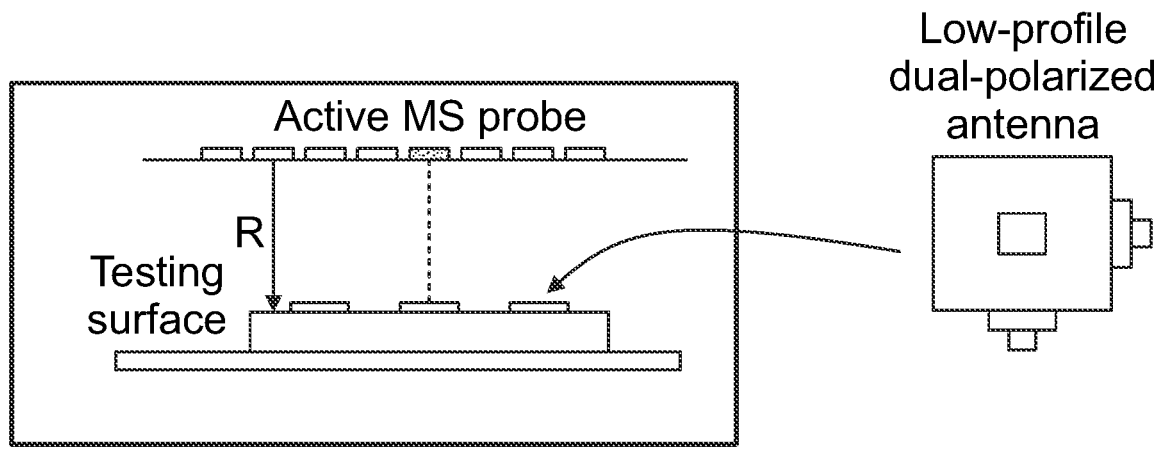
FIG. 23 depicts an implementation of planarity testing in accordance with exemplary embodiments.

Referring to FIG. 23, in accordance with exemplary embodiments implementing planarity testing techniques discussed above require phase measurements at multiple locations on the surface to be tested. As depicted here, an implementation of a monostatic technique uses a dual-polarized low-profile antenna at the surface of interest. A single MS probe may be used in such application to capture phase instead of multiple corresponding MS probes in communication with multiple TX/RX antennas since a single MS probe advantageously needs alignment only between the single MS probe and a single radiator location.

Figure 24:
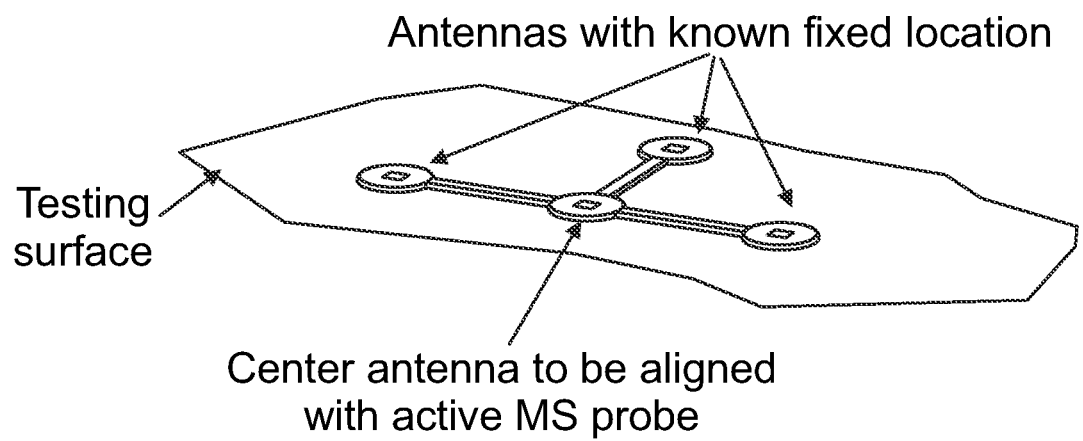
FIG. 24 depicts another implementation of planarity testing in accordance with exemplary embodiments.

Referring to FIG. 24, in accordance with exemplary embodiments, the TX/RX antenna may be aligned with a designated active MS probe. This may be done by measuring phase for multiple ones (e.g., selected ones or all) of the MS probes. The resulting measured phase values may advantageously identify an optimum location and a MS probe present at or closest to such optimum location. The alignment may then be more finely tuned with an XY positioner on the testing surface where the TX/RX antenna is located. Once aligned, the desired phase may be more accurately measured. For a phase measurement of another position, an apparatus as depicted here may be designed so that a more precise distance is known.

Various other modifications and alternatives in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A system configured to use pulsed radio frequency (RF) signals and a modulated scattering probe (MSP) to determine a distance to a surface for a device under test (DUT), the system comprising:
   an RF transmitter to provide first, second, third, and fourth pulsed RF transmit signals;
   an RF receiver;
   the MSP between the RF transmitter and the RF receiver, the MSP to emit first, second, third, and fourth RF scatter signals based on the first, second, third, and fourth pulsed RF transmit signals, respectively;
   wherein the RF receiver is configured to receive the first and second RF scatter signals at a first distance from the MSP;
   wherein the RF receiver is configured to receive the third and fourth RF scatter signals at a second distance from the MSP; and
   one or more processing devices configured to execute instructions to perform operations comprising:
      controlling the RF transmitter to generate the first, second, third, and fourth pulsed RF transmit signals, wherein the first and second pulsed RF transmit signals and the first and second RF scatter signals include mutually distinct first and second carrier signal frequencies having first and second wavelengths, respectively, and wherein the third and fourth pulsed RF transmit signals and the third and fourth RF scatter signals include the mutually distinct first and second carrier signal frequencies having the first and second wavelengths, respectively;
      processing the first and third RF scatter signals to produce first and third phase data related to a first phase difference between the first and third RF scatter signals;

processing the second and fourth RF scatter signals to produce second and fourth phase data related to a second phase difference between the second and fourth RF scatter signals; and processing the first, second, third, and fourth phase data to determine the second distance between the surface and the MSP.

2. The system of claim 1, wherein the RF transmitter comprises multiple transducers having boresights aligned with respective probes on the MSP; and wherein the operations comprise determining a planarity of the surface based on the first, second, third, and fourth phase data.

3. The system of claim 2, wherein determining the planarity of the surface comprises determining a similarity of the first, second, third, and fourth phase data.

4. The system of claim 3, wherein the surface is planar if all of the first, second, third, and fourth phase data are within a known measurement uncertainty.

5. The system of claim 1, wherein the RF transmitter is at the surface, the surface being a location where the DUT is to be tested.

6. A method of using pulsed radio frequency (RF) signals and a modulated scattering probe (MSP) to determine a distance to a surface for a device under test (DUT), the method comprising:

an RF transmitter emitting first, second, third, and fourth pulsed RF transmit signals;

the MSP receiving the first, second, third, and fourth pulsed RF transmit signals and outputting first, second, third, and fourth RF scatter signals based on the first, second, third, and fourth pulsed RF transmit signals, respectively;

an RF receiver receiving the first and second scatter signals at a first distance from the MSP and receiving the third and fourth scatter signals at a second distance from the MSP, the MSP being between the RF transmitter and the RF receiver;

wherein the first and second pulsed RF transmit signals and the first and second RF scatter signals include mutually distinct first and second carrier signal frequencies having first and second wavelengths, respectively, and wherein the third and fourth pulsed RF transmit signals and the third and fourth RF scatter signals include the mutually distinct first and second carrier signal frequencies having the first and second wavelengths, respectively;

processing the first and third RF scatter signals to produce first and third phase data related to a first phase difference between the first and third RF scatter signals;

processing the second and fourth RF scatter signals to produce second and fourth phase data related to a second phase difference between the second and fourth RF scatter signals; and processing the first, second, third, and fourth phase data to determine the second distance between the surface and the MSP.

7. The method of claim 6, wherein the RF transmitter comprises multiple transducers having boresights aligned with respective probes on the MSP; and wherein the method further comprises determining a planarity of the surface based on the first, second, third, and fourth phase data.

8. The method of claim 7, wherein determining the planarity of the surface comprises determining a similarity of the first, second, third, and fourth phase data.

9. The method of claim 8, wherein the surface is planar if all of the first, second, third, and fourth phase data are within a known measurement uncertainty.

10. A system configured to use radio frequency (RF) pulsed signals and a modulated scattering probe (MSP) to determine a distance to a surface for a device under test (DUT), the system comprising:

an RF transmitter to provide first, second, third, and fourth pulsed RF transmit signals;

an RF receiver to receive first, second, third, and fourth RF scatter signals based on the first, second, third and fourth pulsed RF transmit signals, respectively, the RF transmitter and the RF receiver being co-located;

the MSP to receive the first, second, third, and fourth pulsed RF transmit signals and to output the first, second, third, and fourth RF scatter signals; and one or more processing devices to execute instructions to perform operations comprising:

controlling the RF transmitter to generate the first, second, third, and fourth pulsed RF transmit signals, wherein the first and second pulsed RF transmit signals and the first and second RF scatter signals include mutually distinct first and second carrier signal frequencies having first and second wavelengths, respectively, and wherein the third and fourth pulsed RF transmit signals and the third and fourth RF scatter signals include the mutually distinct first and second carrier signal frequencies having the first and second wavelengths, respectively;

processing the first and third RF scatter signals to produce first and third phase data related to a first phase difference between the first and third RF scatter signals;

processing the second and fourth RF scatter signals to produce second and fourth phase data related to a second phase difference between the second and fourth scatter signals; and processing the first, second, third, and fourth phase data to determine a distance from the surface of the MSP.

11. The system of claim 10, wherein the RF transmitter and the RF receiver comprises a transceiver.

12. The system of claim 10, wherein the RF transmitter comprises multiple transducers having boresights aligned with respective probes on the MSP; and wherein the operations comprise determining a planarity of a surface of the DUT based on the first, second, third, and fourth phase data.

13. The system of claim 12, wherein determining the planarity of the surface comprises determining a similarity of the first, second, third, and fourth phase data.

14. The system of claim 13, wherein the surface is planar if all of the first, second, third, and fourth phase data are within a known measurement uncertainty.

15. The system of claim 10, wherein the RF transmitter is at the surface, the surface being a location where the DUT is to be tested.

16. A method of using radio frequency (RF) pulsed signals and a modulated scattering probe (MSP) to determine a distance to a surface for a device under test (DUT), the method comprising:

an RF transmitter emitting first, second, third, and fourth pulsed RF transmit signals;

an RF receiver receiving first, second, third, and fourth RF scatter signals based on the first, second, third and fourth pulsed RF transmit signals, respectively, the RF transmitter and the RF receiver being co-located;

the MSP receiving the first, second, third, and fourth pulsed RF transmit signals and outputting the first, second, third, and fourth RF scatter signals;

wherein the first and second pulsed RF transmit signals and the first and second RF scatter signals include mutually distinct first and second carrier signal frequencies having first and second wavelengths, respectively, and wherein the third and fourth pulsed RE transmit signals and the third and fourth RF scatter signals include the mutually distinct first and second carrier signal frequencies having the first and second wavelengths, respectively, processing the first and third RF scatter signals to produce first and third phase data related to a first phase difference between the first and third RF scatter signals;

processing the second and fourth RF scatter signals to produce second and fourth phase data related to a second phase difference between the second and fourth RF scatter signals; and processing the first, second, third, and fourth phase data to determine a distance from the surface of the MSP.

17. The method of claim 16, wherein the RF transmitter and the RF receiver comprises a transceiver.

18. The method of claim 16, wherein the RF transmitter comprises multiple transducers having boresights aligned with respective probes on the MSP; and wherein the method further comprises determining a planarity of a surface of the DUT based on the first, second, third, and fourth phase data.

19. The method of claim 18, wherein determining the planarity of the surface comprises determining a similarity of the first, second, third, and fourth phase data.

20. The method of claim 19, wherein the surface is planar if all of the first, second, third, and fourth phase data are within a known measurement uncertainty.

\* \* \* \* \*